(12) United States Patent
Kwak

(10) Patent No.: US 7,392,462 B2
(45) Date of Patent: Jun. 24, 2008

(54) METHOD OF FINDING A LAST STATE IN TAIL-BITING FOR TURBO ENCODER AND APPARATUS USING THE SAME

(75) Inventor: Jae-Young Kwak, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 547 days.

(21) Appl. No.: 11/178,892

(22) Filed: Jul. 11, 2005

(65) Prior Publication Data
US 2006/0010362 A1    Jan. 12, 2006

(30) Foreign Application Priority Data
Jul. 9, 2004    (KR)    ............. 10-2004-0053309

(51) Int. Cl.
*H03M 13/03*    (2006.01)
(52) U.S. Cl. .......................................... 714/786
(58) Field of Classification Search ............ 714/786, 714/790, 792
See application file for complete search history.

(56) References Cited

U.S. PATENT DOCUMENTS 5,881,073 A    3/1999    Wan et al. ............... 714/786

6,332,209 B1 *    12/2001    Eroz et al. ............... 714/790
6,530,059 B1    3/2003    Crozier et al. ............... 714/786

FOREIGN PATENT DOCUMENTS

| JP | 02271209 | 9/2002 |
| KR | 000008151 | 2/2000 |
| KR | 030017952 | 3/2003 |

OTHER PUBLICATIONS

Weib et al. Turbo decoding with tail-biting trellises, 1998, IEEE, p. 343-348.*
Perotti et al., A new upper bound on the minimum distance of turbo codes, 2004, google (retrieved Feb. 27, 2008), p. 1 to 6.*
English abstract***.

* cited by examiner

*Primary Examiner*—Shelly A Chase
(74) *Attorney, Agent, or Firm*—F. Chau & Associates, LLC

(57) ABSTRACT

Encoding inputs corresponding to a set of powers of state matrix is added. Powers of state matrix have period T. The set of the powers of the state matrix has an identical state matrix value. One of the powers of the state matrix is multiplied by input matrix and the added encoding inputs. Multiplied results are added so as to find last state of the turbo encoder. The last state corresponds to encoding state of the turbo encoder when the turbo encoding is started at zero state. Final state of the turbo encoder is found using the last state. The final state is identical to initial state of the turbo encoder, and corresponds to encoding state of the turbo encoder when turbo encoding is started with the initial state. Encoding inputs are encoded using the final state.

25 Claims, 7 Drawing Sheets

FIG. 5

| | |
|---|---|
| $AB = \begin{bmatrix} 1 & 0 \\ 1 & 1 \\ 0 & 1 \end{bmatrix}$ | $AB \begin{bmatrix} r_0 \\ r_1 \end{bmatrix} = \begin{bmatrix} r_0 \\ r_0+r_1 \\ r_1 \end{bmatrix}$ |
| $A^2B = \begin{bmatrix} 1 & 1 \\ 1 & 0 \\ 1 & 1 \end{bmatrix}$ | $A^2B \begin{bmatrix} r_2 \\ r_3 \end{bmatrix} = \begin{bmatrix} r_2+r_3 \\ r_2 \\ r_2+r_3 \end{bmatrix}$ |
| $A^3B = \begin{bmatrix} 0 & 0 \\ 1 & 1 \\ 1 & 0 \end{bmatrix}$ | $A^3B \begin{bmatrix} r_4 \\ r_5 \end{bmatrix} = \begin{bmatrix} 0 \\ r_4+r_5 \\ r_4 \end{bmatrix}$ |
| $A^4B = \begin{bmatrix} 1 & 0 \\ 0 & 0 \\ 1 & 1 \end{bmatrix}$ | $A^4B \begin{bmatrix} r_6 \\ r_7 \end{bmatrix} = \begin{bmatrix} r_6 \\ 0 \\ r_6+r_7 \end{bmatrix}$ |
| $A^5B = \begin{bmatrix} 0 & 1 \\ 1 & 0 \\ 0 & 0 \end{bmatrix}$ | $A^5B \begin{bmatrix} r_8 \\ r_9 \end{bmatrix} = \begin{bmatrix} r_9 \\ r_8 \\ 0 \end{bmatrix}$ |
| $A^6B = \begin{bmatrix} 0 & 1 \\ 0 & 1 \\ 1 & 0 \end{bmatrix}$ | $A^6B \begin{bmatrix} r_{10} \\ r_{11} \end{bmatrix} = \begin{bmatrix} r_{11} \\ r_{11} \\ r_{10} \end{bmatrix}$ |
| $A^7B = \begin{bmatrix} 1 & 1 \\ 0 & 1 \\ 0 & 1 \end{bmatrix}$ | $A^7B \begin{bmatrix} r_{12} \\ r_{13} \end{bmatrix} = \begin{bmatrix} r_{12}+r_{13} \\ r_{13} \\ r_{13} \end{bmatrix}$ |

$$\begin{bmatrix} s_0^0 \\ s_0^1 \\ s_0^2 \end{bmatrix} = \begin{bmatrix} r_0+r_2+r_3+r_6+r_9+r_{11}+r_{12}+r_{13} \\ r_0+r_1+r_2+r_4+r_5+r_8+r_{11}+r_{13} \\ r_1+r_2+r_3+r_4+r_6+r_7+r_{10}+r_{13} \end{bmatrix}$$

FIG. 7

| | GATES (INPUT ADDING SECTION) | GATES (MATRIX CALCULATING SECTION) | NUMBER OF GATES | THROUGHPUT | ACTIVATION NUMBER WHEN N=1000 |
|---|---|---|---|---|---|
| CONVENTIONAL | | | 37(1) | 1 | 37000(1) |
| 16BITS | 148 | 193 | 341(9.2) | 1/8 | 148(N/8)+193 (0.51) |
| 32BITS | 180 | 193 | 373(10.2) | 1/16 | 180(N/16)+193 (0.31) |

METHOD OF FINDING A LAST STATE IN TAIL-BITING FOR TURBO ENCODER AND APPARATUS USING THE SAME

This application claims priority to Korean Patent Application No. 2004-53309, filed on Jul. 9, 2004 in the Korean Intellectual Property Office (KIPO), the entire contents of which are incorporated herein by reference.

BACKGROUND OF THE INVENTION

1. Field of the Invention

The present invention relates to a turbo encoder, and more specifically to a turbo encoder using a tail-biting method.

2. Description of Related Art

Turbo-codes have received considerable attention due to their powerful error correcting capability, reasonable complexity, and flexibility in different block sizes and code rates. Turbo-codes are a kind of a convolutional code.

FIG. 1 is a block diagram of a turbo encoder.

Referring to FIG. 1, the turbo encoder includes two recursive systematic convolutional (RSC) encoders 100 and 110 and an interleaver 120.

Turbo encoders are known to have one systematic bit. The turbo encoder in FIG. 1 has two systematic bits $V_t^0$ and $V_t^1$ to increase a transfer rate. Two systematic bits can encode two input bits $u_t^0$ and $u_t^1$ per one clock cycle.

According to the characteristic of the convolutional code, turbo encoders can encode almost infinite input sequences. Turbo encoders begin encoding with an initial state and go on continuously. An example of the initial state is a zero-state, in which all registers of the turbo encoder output a logic '0'.

Due to practical constraints (e.g., synchronization, channel estimation, etc.), many communication systems are block-oriented, and therefore, methods are needed for obtaining code blocks of finite length from a convolutional encoder.

Turbo encoders start encoding at an all-zero state and end encoding at an all-zero state by appending a block of tail bits to data bits to obtain the code blocks. The tail bits cause a loss of the transfer rate due to tail bit termination and other problems, particularly if codewords are short.

FIG. 2 is a state diagram of a turbo encoding method.

Referring to FIG. 2, the turbo encoding method appends a block of tail bits to data bits to obtain the code blocks.

Tail-biting prevents the loss of the transfer rate without degrading error protection ability. Using tail-biting, the state of the encoder at the beginning of the encoding process is not necessarily the all-zero state, but may be another state. Using tail-biting, the encoder is controlled in such a way that the encoder starts and ends the encoding process at the same state. Turbo decoders can determine the initial state and a final state of the turbo encoders by encoding input sequences with the initial state identical to the final state. Thus, the transfer rate loss due to the tail bits may be avoided.

The turbo encoding process using tail-biting is divided into three steps:

<Step1> Determine the last state of the encoder for input sequences. The last state corresponds to a zero state response. The encoder starts at the all-zero state, all input sequences are input, and the output bits are ignored. The last state corresponds to an encoding state of the turbo encoder when the turbo encoder starts an encoding at the zero state.

<Step2> Determine a final state of the turbo encoder using the last state. The final state is identical to an initial state of the turbo encoder. The final state corresponds to an encoding state of the turbo encoder when the turbo encoder starts an encoding with the initial state. <Step 2> can be performed by finding the final state in a look-up table containing the final state corresponding to the last state.

<Step3> Encode input sequences with the initial state that is identical to the final state.

<Step3> can be performed by the hardware identical to that of <Step1>. <Step2> can be performed by the look-up table that stores the final state and the initial state corresponding to the last state.

The overall calculation of tail-biting can be time consuming. Although the hardware used for <Step1> may be used for <Step3>, <Step1> and <Step3> perform encoding twice, adding to the processing time of the turbo encoder and increasing power consumption.

SUMMARY OF THE INVENTION

According to an embodiment of the present disclosure, a method of tail-biting for a turbo encoder includes determining a last state of the turbo encoder based on the following equation 1 using periodicity of powers of a state matrix having a period K, the last state corresponding to an encoding state of the turbo encoder when the turbo encoder starts an encoding at a zero state, determining a final state of the turbo encoder using the last state, the final state being identical to an initial state of the turbo encoder, the final state corresponding to an encoding state of the turbo encoder when the turbo encoder starts the encoding with the initial state, and encoding inputs using the final state.

<Equation 1>
$$\sum_{i=0}^{N-1} A^{N-1-i} B u_i^T = A^{(N-1)\%K} B(u_0^T + u_K^T + u_{2K}^T + \dots)$$
$$+ A^{(N-2)\%K} B(u_1^T + u_{K+1}^T + u_{2K+1}^T + \dots)$$
$$\dots$$
$$+ A^{(N-K+1)\%K} B(u_{K-2}^T + u_{2K-2}^T + u_{3K-2}^T + \dots)$$
$$+ A^{(N-K)\%K} B(u_{K-1}^T + u_{2K-1}^T + u_{3K-1}^T + \dots)$$

wherein K is a natural number equal to or larger than 2, B denotes an input matrix, A denotes a state matrix, $A^K=I$, I is an identity matrix, $u_i$ denotes $i^{th}$ encoding input, and N denotes a number of the encoding inputs.

According to an embodiment of the present disclosure, a method of finding a last state in a tail-biting for a turbo encoder includes modulo-2 adding encoding inputs corresponding to a set of powers of a state matrix to obtain modulo-2 added encoding inputs, the powers of the state matrix having a periodicity of which a period is T, T being a natural number equal to or larger than 2, the set of the powers of the state matrix having a state matrix value identical to each other; multiplying one of the powers of the state matrix by an input matrix and the modulo-2 added encoding inputs, and modulo-2 adding multiplied results.

According to an embodiment of the present disclosure, a method of a tail-biting for a turbo encoder includes modulo-2 adding encoding inputs corresponding to a set of powers of a state matrix to obtain modulo-2 added encoding inputs, the powers of the state matrix having a periodicity of which a period is T, T being a natural number equal to or larger than 2, the set of the powers of the state matrix having a state matrix value identical to each other, and multiplying one of the powers of the state matrix by an input matrix and the modulo-2 added encoding inputs; modulo-2 adding multiplied results to find a last state of the turbo encoder, the last state corresponding to an encoding state of the turbo encoder when the turbo encoder starts an encoding at a zero state. The method further comprises determining a final state of the turbo encoder using the last state, the final state being identical to an initial state of the turbo encoder, the final state corresponding to an encoding state of the turbo encoder when the turbo encoder starts an encoding with the initial state, and encoding encoding inputs using the final state.

According to an embodiment of the present disclosure, an apparatus for finding a last state of a tail-biting turbo encoder includes an input adding section configured to modulo-2 add encoding inputs corresponding to a set of powers of a state matrix to obtain modulo-2 added encoding inputs, the powers of the state matrix having a periodicity of which a period is T, T being a natural number equal to or larger than 2, the set of the powers of the state matrix having a state matrix value identical to each other, and a matrix calculating section configured to multiply one of the powers of the state matrix by an input matrix and the modulo-2 added encoding inputs, and configured to modulo-2 add multiplied results to find the last state.

According to an embodiment of the present disclosure, an apparatus for calculating series of multiplications between powers of a first matrix and second matrices includes an input adding section configured to modulo-2 add the second matrices corresponding to a set of powers of the first matrix to obtain modulo-2 added second matrices, the powers of the first matrix having a periodicity of which a period is T, T being a natural number equal to or larger than 2, the set of the powers of the first matrix having a matrix value identical to each other; and a matrix calculating section configured to multiply one of powers of the first matrix by the modulo-2 added second matrices, and configured to modulo-2 add multiplied results to calculate the series.

BRIEF DESCRIPTION OF THE DRAWINGS

The above and other features of the present invention will become more apparent by describing in detail embodiments thereof with reference to the accompanying drawings, in which:

FIG. 5 is a table showing powers of a state matrix multiplied by input matrix;

FIG. 7 is a table illustrating an effect of a turbo encoder according to an embodiment of the present disclosure compared with the conventional turbo encoder.

DETAILED DESCRIPTION OF PREFERRED EMBODIMENTS

Specific structural and functional details disclosed herein are merely representative for purposes of describing embodiments of the present disclosure. However, details of the present disclosure may be embodied in many alternate forms and should not be construed as limited to embodiments set forth herein, but on the contrary, the invention is to cover all modifications, equivalents, and alternatives failing within the spirit and scope of the invention. Like numbers refer to like elements throughout the description of the figures.

Figure 1:
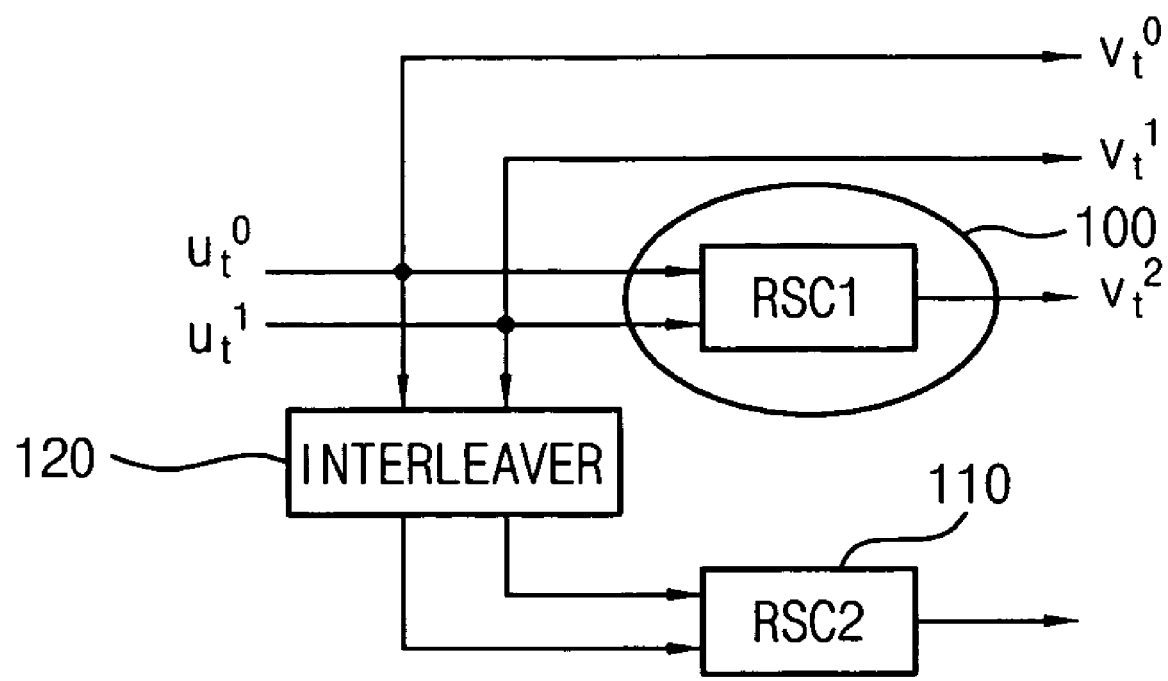
FIG. 1 is a block diagram of a conventional turbo encoder.
Figure 2:
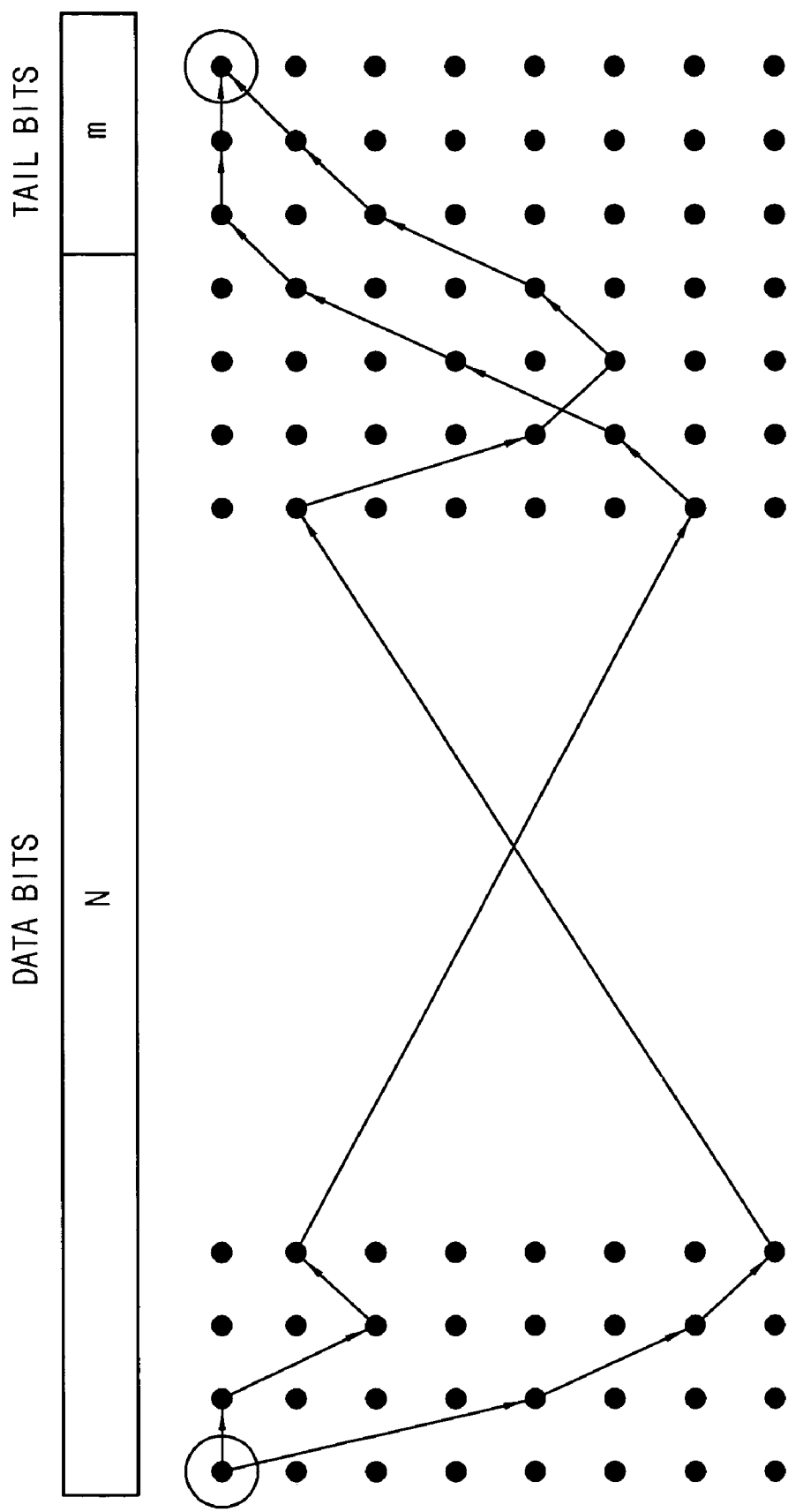
FIG. 2 is a state diagram of a conventional turbo encoding method.
Figure 3:
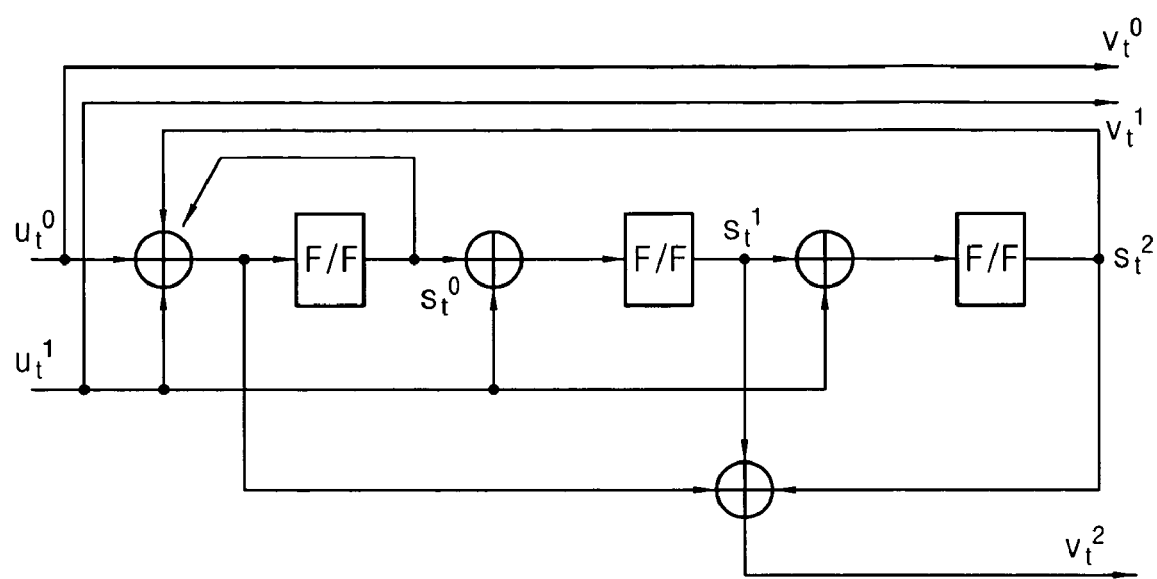
FIG. 3 is a block diagram illustrating a recursive systematic convolutional encoder in accordance with an embodiment of the present disclosure.

FIG. 3 is a block diagram illustrating a recursive systematic convolutional encoder in accordance with an embodiment of the present disclosure.

Referring to FIG. 3, the recursive systematic convolutional encoder receives two encoding input bits $u_t^0$ and $u_t^1$ and outputs three output bits $V_t^0$, $V_t^1$ and $V_t^2$. The use of two systematic bits $V_t^0$ and $V_t^1$ may increase a transfer rate of the encoder; broad band wireless access (IEEE802.16) and high speed portable internet (HPI) use two systematic bits. The encoding inputs illustrated in FIG. 3 may be expressed as shown in the expression 1.

$$u = (u_0^0, u_0^1, u_1^0, u_1^1, \ldots, u_t^0, u_t^1, \ldots, u_{N-1}^0, u_{N-1}^1) \quad \text{<Expression 1>}$$
$$= (u_0, u_1, \ldots, u_t, \ldots, u_{N-1})$$

A state and an output of the recursive systematic convolutional encoder can be expressed as shown in expression 2 and expression 3.

$$s_{t+1} = As_t + Bu_t^T \quad \text{<Expression 2>}$$

$$v_t^T = Cs_t + Du_t^T \quad \text{<Expression 3>}$$

Matrix A in expression 2 is a state matrix of the recursive systematic convolutional encoder and matrix B is an input matrix. Expression 2 can be modified as shown in expression 4 using an initial state $S_0$.

$$s_t = A^t s_0 + \sum_{i=0}^{t-1} A^{t-1-i} Bu_i^T \quad \text{<Expression 4>}$$

Referring to FIG. 3, the first term of the right side of expression 4 represents an initial state, and the second term of the right side represents the zero state calculation. Using $s_N = s_0$ in the expression 4, a final state, which is identical to an initial state, may be determined.

$$(A^N + I)s_0 = \sum_{i=0}^{N-1} A^{N-1-i} Bu_i^T \quad \text{<Expression 5>}$$

$S_0$ in the expression 5 corresponds to the final state, which is identical to the initial state. Thus, using $S_0$ in expression 5, input sequences can be encoded using a tail-biting method.

The right side of the expression 5 represents an encoding state of the turbo encoder after the turbo encoder encodes at a zero-state (i.e. $S_0$=zero). The conventional tail-biting encoding method determines the right side of the expression 5 by encoding input sequences using the recursive systematic convolutional encoder in FIG. 3. The turbo encoder according to an embodiment of the present disclosure determines the right side of the expression 5 through a parallel operation (or parallel processing) so that the calculation time and the power consumption may decrease.

Expression 6 represents the state matrix 'A' and the input matrix 'B' of the recursive systematic convolutional encoder in FIG. 3. The state matrix 'A' and the input matrix 'B' represent the characteristics of the recursive systematic convolutional encoder. The state matrix 'A' may be a 3×3 matrix and the input matrix 'B' may be a 3×2 matrix when the recursive systematic convolutional encoder has three flip-flops and two bits encoding inputs.

$$A = \begin{bmatrix} 1 & 0 & 1 \\ 1 & 0 & 0 \\ 0 & 1 & 0 \end{bmatrix}, B = \begin{bmatrix} 1 & 1 \\ 0 & 1 \\ 0 & 1 \end{bmatrix} \qquad \text{<Expression 6>}$$

A power '$A^M$' of the state matrix may be an identity matrix. Therefore, the powers of the state matrix have periodicity. For example, the powers of the state matrix have a period of 7 as shown in the expression 7.

$$A^2 = \begin{bmatrix} 1 & 1 & 1 \\ 1 & 0 & 1 \\ 1 & 0 & 0 \end{bmatrix}, A^3 = \begin{bmatrix} 0 & 1 & 1 \\ 1 & 1 & 1 \\ 1 & 0 & 1 \end{bmatrix}, A^4 = \begin{bmatrix} 1 & 1 & 0 \\ 0 & 1 & 1 \\ 1 & 1 & 1 \end{bmatrix},$$

$$A^5 = \begin{bmatrix} 0 & 0 & 1 \\ 1 & 1 & 0 \\ 0 & 1 & 1 \end{bmatrix}, A^6 = \begin{bmatrix} 0 & 1 & 0 \\ 0 & 0 & 1 \\ 1 & 1 & 0 \end{bmatrix} A^7 = \begin{bmatrix} 1 & 0 & 0 \\ 0 & 1 & 0 \\ 0 & 0 & 1 \end{bmatrix} = I \qquad \text{<Expression 7>}$$

Using periodicity of the powers of the state matrix, the right side of the expression 5 may be determined by the parallel operation. The right side of the expression 5 may be expressed as shown in expression 8.

$$\sum_{i=0}^{N-1} A^{N-1-i} B u_i^T = A^{N-1} B u_0^T + A^{N-2} B u_1^T + \ldots \qquad \text{<Expression 8>}$$
$$+ A^1 B u_{N-2}^T + B u_{N-1}^T$$
$$= A^{(N-1)\%7} B(u_0^T + u_7^T + u_{14}^T + \ldots)$$
$$+ A^{(N-2)\%7} B(u_1^T + u_8^T + u_{15}^T + \ldots)$$
$$\ldots$$
$$+ A^{(N-6)\%7} B(u_5^T + u_{12}^T + u_{19}^T + \ldots)$$
$$+ A^{(N-7)\%7} B(u_6^T + u_{13}^T + u_{20}^T + \ldots)$$

Referring to the expression 8, the powers of the state matrix 'A' are repeated with the period 7 so that the last state (i.e. the right side of the expression 5) of the turbo encoder may be determined by adding a set of encoding inputs corresponding to a set of powers of the state matrixes that has a state matrix value identical each other, by multiplying the power of the state matrix by the input matrix and by the added results, and then by adding the multiplied results.

Figure 4:
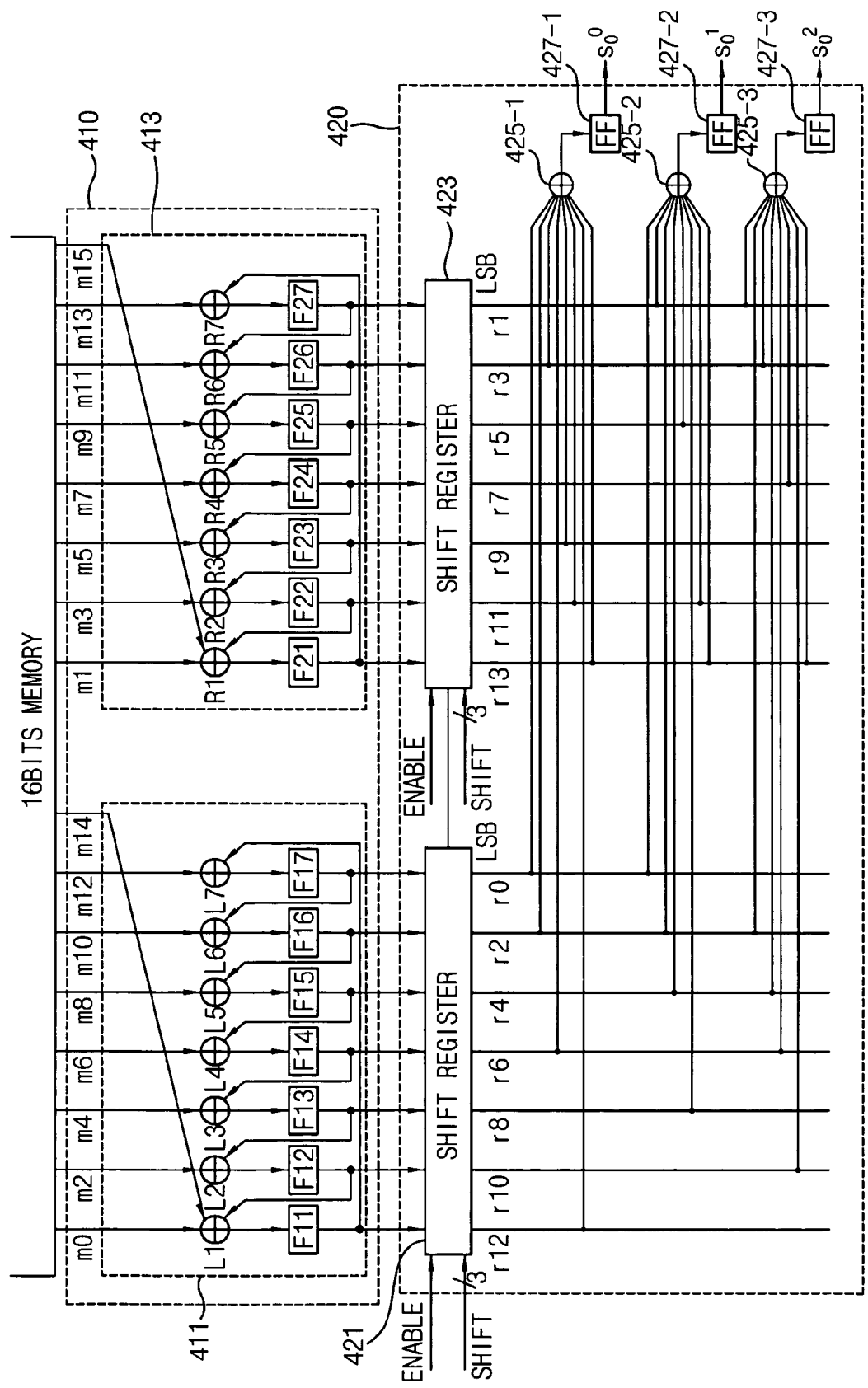
FIG. 4 is a block diagram illustrating an apparatus for finding a last state of a tail-biting turbo encoder in accordance with an embodiment of the present disclosure.

FIG. 4 is a block diagram illustrating an apparatus for finding a last state of a tail-biting turbo encoder in accordance with one example embodiment of the present invention.

Referring to FIG. 4, an apparatus for finding a last state of a tail-biting turbo encoder includes an input adding section 410 and a matrix calculating section 420. In this embodiment of the present disclosure, 16-bit memory stores two-bit encoding inputs and the 16-bit memory outputs eight (16 bits) encoding inputs at one time.

The input adding section 410 adds (e.g., modulo-2 adds) the encoding inputs corresponding to a set of the powers of the state matrix. A set of the powers of the state matrix comprises the state matrixes that have a state matrix value identical to each other. For example, when the powers of the state matrix have the period of 7, N=30, and a set of the powers of the state matrix includes $A^7, A^6, A^5, A^4, A^3, A^2$ and $A^1$, the encoding inputs corresponding to the set $(A^1, A^8, A^{15}, A^{22}, A^{25}, $ and $A^{29})$ of the powers of the state matrix include $u_0^T, u_7^T, u_{14}^T, u_{21}^T$ and $u_{28}^T$.

The input adding section 410 includes bit adding sections 411 and 413.

The bit adding section 411 adds the first bits of the encoding inputs corresponding to a set of the powers of the state matrix. The bit adding section 413 adds the second bits of the encoding inputs corresponding to a set of the powers of the state matrix.

The bit adding sections 411 and 413 have identical structure and the number of the bit adding sections is decided in accordance with the number of the bits of the encoding input.

For example, each of the bit adding sections 411 and 413 includes seven modulo-2 adders L1, L2, . . . , L7 and seven flip-flops F11, F12, . . . , and F17.

Hereinafter, the operation of the input adding section 410 will be explained. The 16-bit memory outputs eight two-bit encoding inputs. The 16-bit memory stores the encoding inputs in such an order as shown in expression 9. As shown in FIG. 4, the first bits (m0, m2, m4, m6, m8, m10, m12, m14) of the 16-bit memory are inputted to the bit adding section 411 and the second bits (m1, m3, m5, m7, m9, m11, m13, m15) of the 16-bit memory are inputted to the bit adding section 413. m0 through m15 in the right side of the expression 9 represent the bit number of the 16-bit memory.

$$(u_0^0, u_0^1, u_1^0, u_1^1, \ldots, u_7^0, u_7^1) = (m0, m1, m2, m3, \ldots, m14, m15) \qquad \text{<Expression 9>}$$

Referring to FIG. 4, the first bits of eight encoding inputs are inputted to the bit adding section 411 and the second bits of eight encoding inputs are inputted to the bit adding section 413. The operation of the bit adding section 413 may be understood by the operation of the bit adding section 411.

The bit adding section 411 receives the first bits of the eight encoding inputs and adds the first bits of the every seventh encoding input. Thereby, the bit adding section 411 performs the calculations shown in expression 10 through expression 16.

$$(u_0^0 + u_7^0 + u_{14}^0 + \ldots) \qquad \text{<Expression 10>}$$
$$(u_1^0 + u_8^0 + u_{15}^0 + \ldots) \qquad \text{<Expression 11>}$$
$$(u_2^0 + u_9^0 + u_{16}^0 + \ldots) \qquad \text{<Expression 12>}$$
$$(u_3^0 + u_{10}^0 + u_{17}^0 + \ldots) \qquad \text{<Expression 13>}$$
$$(u_4^0 + u_{11}^0 + u_{18}^0 + \ldots) \qquad \text{<Expression 14>}$$
$$(u_5^0 + u_{12}^0 + u_{19}^0 + \ldots) \qquad \text{<Expression 15>}$$
$$(u_6^0 + u_{13}^0 + u_{20}^0 + \ldots) \qquad \text{<Expression 16>}$$

For example, in expression 10, in the first clock cycle, the bit adding section 411 receives the first bits ($u_0^0 \sim u_7^0$) of the $1^{st}$ through $8^{th}$ encoding inputs. The modulo-2 adder L1 adds $u_0^0$(m0) and $u_7^0$(m14) and the flip-flop F11 stores $u_0^0 + u_7^0$. In the second clock cycle, the bit adding section 411 receives the first bits ($u_8^0 \sim u_{15}^0$) of the $9^{th}$ through $16^{th}$ encoding inputs. The modulo-2 adder L7 adds $u_{14}^0$ (m12) and the output $u^{o0} + u_7^0$ of the flip-flop F11 and the flip-flop F17 stores $u_0^0 + u_7^0 + u_{14}^0$. In the third clock cycle, the bit adding section 411 receives the first bits ($u_{16}^0 \sim u_{23}^0$) of the $17^{th}$ through $24^{th}$ encoding inputs. The modulo-2 adder L6 adds $u_{21}^0$(m10) and the output $u_0^0 + u_7^0 + u_{14}^0$ of the flip-flop F17 and the flip-flop F16 stores $u_0^0 + u_7^0 + u_{14}^0 + u_{21}^0$. The bit adding section in FIG. 4 repeats the above operation in every clock cycle to perform the calculation shown in the expression 10. The calculations shown in the expression 11 through expression 16 may be understood by the above description of the calculation shown in the expression 10.

The bit adding section 413 receives the second bits ($u_0^1 \sim u_7^1$) of the eight encoding inputs and adds the second bits of the every seventh encoding input. Thereby, the bit adding section 413 performs calculations shown in expression 17 through expression 23.

$$(u_0^1 + u_7^1 + u_{14}^1 + \ldots) \qquad \text{<Expression 17>}$$

$$(u_1^1 + u_8^1 + u_{15/1}^1 + \ldots) \qquad \text{<Expression 18>}$$

$$(u_2^1 + u_9^1 + u_{16}^1 + \ldots) \qquad \text{<Expression 19>}$$

$$(u_3^1 + u_{10}^1 + u_{17}^1 + \ldots) \qquad \text{<Expression 20>}$$

$$(u_4^1 + u_{11}^1 + u_{18}^1 + \ldots) \qquad \text{<Expression 21>}$$

$$(u_5^1 + u_{12}^1 + u_{19}^1 + \ldots) \qquad \text{<Expression 22>}$$

$$(u_6^1 + u_{13}^1 + u_{20}^1 + \ldots) \qquad \text{<Expression 23>}$$

The bit adding section 413 has the structure identical to the structure of the bit adding section 411 and operates in the same manner to perform the calculations shown in the expression 17 through the expression 23.

Therefore, the bit adding sections 411 and 413 add (modulo-2 add) the first bits and the second bits of the encoding inputs corresponding to a set of the powers of the state matrix, respectively. The input adding section 410 continues the operation until all encoding inputs are added. The modulo-2 addition, seven flip-flops F11 through F17 in the bit adding section 411 store the results of the calculations shown in the expression 10 through the expression 16, and seven flip-flops F21 through F27 in the bit adding section 413 store the results of the calculations shown in the expression 17 through the expression 23. Thus, the bit adding section 411 stores the results corresponding to the first bits of the encoding inputs, and the bit adding section 413 stores the results corresponding to the second bits of the encoding inputs.

Each of the bit adding sections 411 and 413 includes seven modulo-2 adders and seven flop-flops in a case where the powers of the state matrix are repeated with a period 7.

The bit adding sections 411 and 413 store the results of the calculations shown in the expressions 10 through 23. The location of the stored results varies in accordance with a number of the encoding inputs because the stored results move to other flop-flops in every clock cycle, however the sequence (or order) of the stored results does not vary. The stored results may be sorted by shift registers because the order of the stored results does not vary. The matrix calculating section 420 sorts the stored results.

The matrix calculation section 420 receives output signals of the input adding section 410. The matrix calculation section 420 multiplies one of the powers of the state matrix 'A' by the input matrix 'B' and modulo-2 added encoding inputs, and adds (e.g., modulo-2 adds) multiplied results to find a last state of the turbo encoder.

The matrix calculation section 420 includes two shift registers 421 and 423, three modulo-2 adders 425-1, 425-2, and 425-3, and three flip-flops 427-1, 427-2, and 427-3.

Two shift registers 421 and 423 receive the 7-bit outputs of the bit adding sections 411 and 413, respectively. Each of the shift registers 421 and 423 receive an enable signal ENABLE and a 3-bit shift signal SHIFT. The enable signal ENABLE enables the operation of the shift registers 421 and 423 and the 3-bit shift signal SHIFT determines the shift stages (shift bits) of the shift registers. The shift operation of the shift registers 421 and 423 may be left shift or right shift. For example, the shift operation of the shift registers 421 and 423 is a rotational right shift.

The flip-flops F11 through F17 of the input adding section 410 store the modulo-2 added results of the encoding inputs corresponding to a set of the powers of the state matrix 'A'. The location of the stored results varies in accordance with the number of the encoding inputs because the stored results move to other flop-flops in every clock cycles.

The shift registers 421 and 423 of the matrix calculating section 420 shift the location of the stored results such that the stored result corresponding to the state matrix '$A^1$' is located in the LSB (Least Significant Bit).

For example, in case that thirty (N=30) 2-bit encoding inputs are input from the 16-bit memory during four clock cycles, the stored result $u_0^0 + u_7^0 + u_{14}^0 + u_{21}^0 + u_{28}^0$ may be stored into flop-flop F15 of the bit adding section 411. The memory bits that do not correspond to the encoding inputs in the fourth clock cycle are assumed to be logic '0'. The stored result $u_1^0 + u_8^0 + u_{15}^0 + u_{22}^0 + u_{29}^0$ may be stored into flip-flop F16 and other stored results are stored in the similar manner. In case that the encoding inputs are thirty (N=30) 2-bit encoding inputs, the expression 8 may be expressed as shown below.

$$\sum_{i=0}^{29} A^{29-i} Bu_i^T = A^{29} Bu_0^T + A^{28} Bu_1^T + \ldots + A^1 Bu_{28}^T + Bu_{29}^T \qquad \text{<Expression 24>}$$

$$= AB(u_0^T + u_7^T + u_{14}^T + u_{21}^T + u_{28}^T)$$

$$+ A^7 B(u_1^T + u_8^T + u_{15}^T + u_{22}^T + u_{29}^T)$$

$$+ A^6 B(u_2^T + u_9^T + u_{16}^T + u_{23}^T)$$

$$+ A^5 B(u_3^T + u_{10}^T + u_{17}^T + u_{24}^T)$$

$$+ A^4 B(u_4^T + u_{11}^T + u_{18}^T + u_{25}^T)$$

$$+ A^3 B(u_5^T + u_{12}^T + u_{19}^T + u_{26}^T)$$

$$+ A^2 B(u_6^T + u_{13}^T + u_{20}^T + u_{27}^T)$$

The shift registers 421 and 423 needs to perform 2-bit rotational right shift operation to output the stored results $u^0_0 + u_7^0 + u_{14}^0 + u_{21}^0 + u_{28}^0$ and $u_0^1 + u_7^1 + u_{14}^1 + u_{21}^1 + u_{28}^1$, which are multiplied with the state matrix '$A^1$', to LSB. Thus, the shift registers 421 and 423 perform 2-bit right shift operation on the stored results so as to align the stored results. This operation may be performed by activating the enable signal ENABLE and applying logic "010" to the 3-bit shift signal SHIFT. The shift registers 421 and 423 need to perform maximum six bit shift operation in a case where the powers of the state matrix 'A' are repeated with a period 7 and the outputs of the bit adding section 411 and 413 are 7-bits, respectively.

In a case where the number of the encoding inputs are eight, the input adding section 410 receives all encoding inputs for one clock cycle. The stored result corresponding to the state matrix A is $u_6^T$ (N=8 in equation 8), which is stored in the flip-flops F17 and F27 that are located in the right end of the bit adding sections 411 and 413, respectively. Therefore, the shift registers 421 and 423 of the matrix calculating section 420 need not to perform shift operation.

In a case where the number of the encoding inputs are sixteen, the input adding section 410 receives all encoding inputs for two clock cycles. The stored result corresponding to the state matrix 'A' is $u_0^T + u_7^T + u_{14}^T$ (N=16 in equation 8), which is stored in flip-flops F17 and F27 that are located in the right end of the bit adding sections 411 and 413, respectively. Therefore, the shift registers 421 and 423 of the matrix calculating section 420 need not to perform shift operation.

In a case where the number of the encoding inputs are twenty-four, the input adding section 410 receives all encoding inputs for three clock cycles. The stored result corresponding to the state matrix A is $u_1^T+u_8^T+u_{15}^T+u_{22}^T$ (N=24 in equation 8), which is stored in the flip-flops F17 and F27 that are located in the right end of the bit adding sections 411 and 413, respectively. Therefore, the shift registers 421 and 423 of the matrix calculating section 420 need not to perform shift operation.

In a case where the number of the encoding inputs are thirty-two, the input adding section 410 receives all encoding inputs for four clock cycles. The stored result corresponding to the state matrix A is $u_2^T+u_9^T+u_{16}^T+u_{23}^T+u_{30}^T$ (N=32 in equation 8), which is stored in flip-flop F17 and F27 that are located in the right end of the bit adding sections 411 and 413, respectively. Therefore, the shift registers 421 and 423 of the matrix calculating section 420 need not to perform shift operation.

As described above, the shift registers 421 and 423 need not to perform shift operation when the number of the encoding inputs is a multiple of eight. Every eight encoding inputs mean an increase of modulo 7 residue and one-bit shift of the stored results corresponding to one more clock cycle that cancel each other.

The multiplying operation of the matrix calculating section 420 will be described below.

FIG. 5 is a table illustrating a multiplication table of powers of a state matrix 'A' multiplied by input matrix 'B' as shown in the expression 6 and the expression 7. r0 through r13 in FIG. 5 denote the output signals of the shift registers 421 and 423 of the matrix calculating section 420. The shift registers 421 and 423 of the matrix calculating section 420 output the stored result (r0, r1) corresponding to the state matrix $A^1$ to LSB, the stored result (r2, r3) corresponding to the state matrix $A^2$ to the left of the LSB and the stored result (r4, r5) corresponding to the state matrix $A^3$ to the second left of the LSB so that the multiplied results are expressed as shown in FIG. 5. The result of the expression 8 (the last state of the turbo encoder) may be expressed as in FIG. 5. Therefore, the last state of the turbo encoder may be determined by modulo-2 adding as shown in the matrix calculating section 420 in FIG. 4. Namely, the last state of the turbo encoder is the same as the result $s_0^0$, $s_0^1$ and $s_0^2$.

Figure 6:
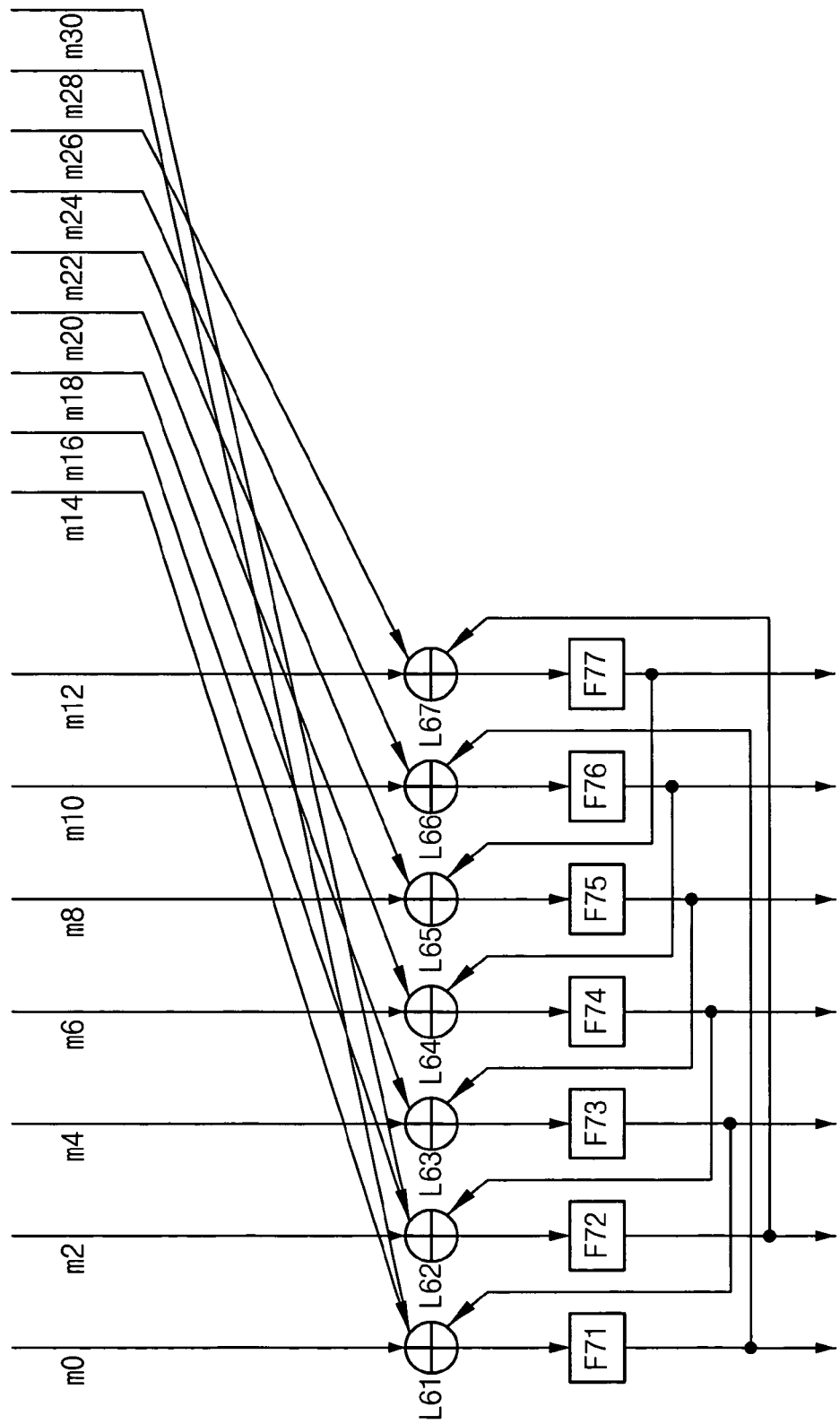
FIG. 6 is a block diagram illustrating a bit adding section in FIG. 4 in accordance with an embodiment of the present disclosure.

FIG. 6 is a block diagram illustrating a bit adding section in FIG. 4 in accordance with an embodiment of the present disclosure.

Referring to FIG. 6, 32-bit memory stores the encoding inputs and the 32-bit memory outputs sixteen (32 bits) encoding inputs in one clock cycle.

The bit adding section in FIG. 6 receives 16-bit signal corresponding to the first or the second bits of the encoding inputs.

The bit adding section in FIG. 6 includes seven modulo-2 adders L61 through L67 and seven flip-flops F71 through F77. The bit adding section in FIG. 6 is configured to add every seventh signal of the 16-bit signal. In the bit adding section in FIG. 6, the output signals of the flip-flops are input to two-bit left modulo-2 adders. For example, the output signal of the flip-flop F77 is input to two-bit left modulo-2 adder L65, and the output signal of the flip-flop F76 is input to two-bit left modulo-2 adder L64.

The output signals of the flip-flops F71 through F77 are respectively input to two-bit left modulo-2 adders in a case where sixteen encoding inputs are received by the 32-bit memory in every clock cycle (16 modulo 7 residue is 2). In contrast, when the bit adding section receives 8-bit signal as shown in FIG. 5, the output signals of the flip-flops F11 through F17 are respectively input to one-bit left modulo-2 adders in a case where eight encoding inputs are received by the 16-bit memory in every clock cycle (8 modulo 7 residue is 1).

The bit adding sections 411 and 413 in FIG. 4 may be replaced with the bit adding section in FIG. 6 when 32-bit memory is used.

In an apparatus for finding a last state of a tail-biting turbo encoder using the bit adding section in FIG. 6, the structure of the matrix calculating section 420 needs not to be changed, however the shift operation of the matrix calculating section 420 needs to be changed.

For example, in a case where the number of the encoding inputs is sixteen, the shift registers of the matrix calculating section 420 need not perform the shift operation in FIG. 4. The shift registers need to perform one-bit rotational left shift operation when the bit adding section in FIG. 6 is used. In a case where the number of the encoding inputs are thirty-two, the bit adding section in FIG. 6 needs two clock cycles to receive all encoding inputs. The stored result corresponding to the state matrix $A^1$ is $u_2^T+u_9^T+u_{16}^T+u_{23}^T+u_{30}^T$ (N=in equation 8), which is stored in the flip-flop F71 of the bit adding section in FIG. 6. Therefore, the shift registers need to perform one-bit rotational left shift operation. In a case where the number of the encoding inputs is forty eight, the bit adding section in FIG. 6 needs three clock cycles to receive all encoding inputs. The stored result corresponding to the state matrix $A^1$ is $u_4^T+u_{11}^T+u_{18}^T+u_{25}^T+u_{32}^T+u_{39}^T+u_{46}^T$ (N=48 in equation 8), which is stored in the flip-flop F71 of the bit adding section in FIG. 6. Therefore, the shift registers need to perform one-bit rotational left shift operation.

Consequently, in a case where the number of the encoding inputs is a multiple of sixteen, the shift registers that receive the output signals of the bit adding section in FIG. 6 need one-stage (one-bit) rotational left shift.

The apparatus in FIG. 4 and FIG. 6 may be used for matrix calculation. If powers of a first matrix are repeated with a period k as the state matrix A in the expression 7, the apparatus in FIG. 4 and FIG. 6 could be used for determining the series of the multiplications of the powers of the first matrix by second matrices (the second matrices are sequence of a matrix).

FIG. 7 is a table illustrating an effect of a turbo encoder according to an embodiment of the present disclosure as compared to a conventional turbo encoder.

Referring to FIG. 7, the conventional method of finding the last state of the tail-biting needs about 37 gates because of the reusability of the recursive systematic convolutional encoder in FIG. 3. For the conventional method of finding the last state of the tail-biting every encoding input takes one clock cycle. Moreover, when the 37 gates are all activated, the conventional method of finding the last state of the tail-biting needs about 37,000 activations for 1,000 encoding inputs because all hardware needs to operate in all clock cycles.

According to an embodiment of the present disclosure, the apparatus in FIG. 4 using 16-bit memory needs about 148 gates for the input adding section and about 193 gates for the matrix calculating section so that the number of the total gates may be about 341. The apparatus in FIG. 4 manages operations for eight encoding inputs in one clock cycle so that the encoding time becomes about eight times faster than the conventional method. Moreover, the apparatus in FIG. 4, using 16-bit memory, needs about 18,693 activations for 1,000 encoding inputs because the matrix calculation section activates one time for the 1,000 encoding inputs. Therefore, the apparatus of FIG. 4 may decrease the power consumption to about 0.51 times than that of the conventional method.

The apparatus using the bit adding section in FIG. 6 and 32-bit memory needs about 373 gates and may operate about sixteen times faster and while using about three times less power than the conventional method to find the last state of the turbo encoder.

In FIG. 4 and FIG. 6, the apparatuses using 16-bit memory and 32-bit memory are explained. However, other memories may be used, for example, 64-bit, 128-bit or 256-bit memory. In a case where 64 (or more)-bit memory is used, bit adding sections may include seven modulo-2 adders and seven flip-flops as the bit adding section in FIG. 4 but connection between the modulo-2 adders and flip-flops may be changed. The matrix calculating section in FIG. 4 may be used for the apparatus using the 64 (or more)-bit memory. Moreover, the number of the bit adding section may be increased according to the number of bits of the encoding inputs.

According to an embodiment of the present disclosure, a method and apparatus for finding the last state in tail biting for the turbo encoder using the periodicity of powers of a state matrix with a period achieves faster operation and lower power consumption. When the codewords are very long, the method and the apparatus according to an embodiment of the present disclosure further reduces the operation time and power consumption.

While embodiments of the present disclosure have been described in detail, it should be understood that various changes, substitutions and alterations may be made herein without departing from the scope of the invention.

What is claimed is:

1. A method of tail-biting for a turbo encoder comprising:
finding a last state of the turbo encoder according to equation 1, using periodicity of powers of a state matrix having a period K, the last state corresponding to an encoding state of the turbo encoder when the turbo encoder starts an encoding at a zero state, $$\sum_{i=0}^{N-1} A^{N-1-i} B u_i^T = A^{(N-1)\%K} B(u_0^T + u_K^T + u_{2K}^T + \ldots )$$
$$+ A^{(N-2)\%K} B(u_1^T + u_{K+1}^T + u_{2K+1}^T + \ldots )$$
$$\ldots$$
$$+ A^{(N-K+1)\%K} B(u_{K-2}^T + u_{2K-2}^T + u_{3K-2}^T + \ldots )$$
$$+ A^{(N-K)\%K} B(u_{K-1}^T + u_{2K-1}^T + u_{3K-1}^T + \ldots )$$

<Equation 1> wherein K is a natural number equal to or larger than 2, B denotes an input matrix, A denotes a state matrix, $A^K=I$, I is an identity matrix, $u_i$ denotes $i^{th}$ encoding input, and N denotes a number of the encoding inputs;
finding a final state of the turbo encoder using the last state, the final state being identical to an initial state of the turbo encoder, the final state corresponding to an encoding state of the turbo encoder when the turbo encoder starts the encoding with the initial state; and
encoding inputs using the final state.

2. A method of finding a last state in a tail-biting for a turbo encoder, comprising:
adding encoding inputs corresponding to a set of powers of a state matrix to obtain added encoding inputs, the powers of the state matrix having a periodicity of which a period is T, T being a natural number equal to or larger than 2, the set of the powers of the state matrix having a state matrix value identical to each other;
multiplying one of the powers of the state matrix by an input matrix and the added encoding inputs; and
adding multiplied results to determine a last state of the turbo encoder.

3. The method of claim 2, wherein the adding comprises performing module-2 addition.

4. The method of claim 2, wherein the last state corresponds to an encoding state of the turbo encoder when the turbo encoder starts an encoding at a zero state, the method further comprising
finding a final state of the turbo encoder using the last state, the final state being identical to an initial state of the turbo encoder, the final state corresponding to an encoding state of the turbo encoder when the turbo encoder starts an encoding with the initial state; and
encoding inputs using the final state.

5. An apparatus for finding a last state of a tail-biting turbo encoder comprising:
an input adding section configured to add encoding inputs corresponding to a set of powers of a state matrix to obtain added encoding inputs, the powers of the state matrix having a periodicity of which a period is T, T being a natural number equal to or larger than 2, the set of the powers of the state matrix having a state matrix value identical to each other; and
a matrix calculating section configured to multiply one of the powers of the state matrix by an input matrix and the modulo-2 added encoding inputs, and configured to add multiplied results to find the last state.

6. The apparatus of claim 5, wherein the input adding section performs modulo-2 addition and includes bit adding sections, and a number of the bit adding sections is identical to a bit number of the encoding input.

7. The apparatus of claim 6, wherein the bit adding section comprises modulo-2 adders and flip-flops.

8. The apparatus of claim 7, wherein a number of the modulo-2 adders are T and a number of the flip-flops are T.

9. The apparatus of claim 8, wherein each of the modulo-2 adders receives at least one first input signal from a memory and one input signal from one of the flip-flops.

10. The apparatus of claim 5, wherein the matrix calculating section comprises:
shift registers configured to align outputs of the input adding section;
modulo-2 adders configured to modulo-2 add output signals of the shift registers according to multiplications between the powers of the state matrix and the input matrix.

11. The apparatus of claim 10, wherein each of the shift registers receives T-bit input, performs rotational shifts on the T-bit input and outputs a shifted T-bit output.

12. The apparatus of claim 10, wherein a number of the modulo-2 adders is identical to a row number of the state matrix.

13. The apparatus of claim 10, wherein a number of the shift registers is identical to a bit number of the encoding inputs.

14. The apparatus of claim 10, wherein the shift registers may control a shift stage based on the number of the encoding inputs.

15. The apparatus of claim 14, wherein each of the shift registers shifts maximum T−1 bit.

16. An apparatus for calculating series of multiplications between powers of a first matrix and second matrices comprising:

an input adding section configured to add the second matrices corresponding to a set of powers of the first matrix to obtain added second matrices, the powers of the first matrix having a periodicity of which a period is T, T being a natural number equal to or larger than 2, the set of the powers of the first matrix having a matrix value identical to each other; and a matrix calculating section configured to multiply one of powers of the first matrix by the added second matrices, and configured to add multiplied results to calculate the series.

17. The apparatus of claim 16, wherein the input adding section performs modulo-2 addition and includes bit adding sections, and a number of the bit adding sections is identical to a row number of the second matrices.

18. The apparatus of claim 17, wherein the bit adding section comprises modulo-2 adders and flip-flops.

19. The apparatus of claim 18, wherein a number of the modulo-2 adders are T and a number of the flip-flops are T.

20. The apparatus of claim 19, wherein each of the modulo-2 adders receives at least one first input signal from a memory and one second input signal from one of the flip-flops.

21. The apparatus of claim 16, wherein the matrix calculating section comprises:
shift registers configured to align outputs of the input adding section;
modulo-2 adders configured to modulo-2 add output signals of the shift registers according to the powers of the first matrix to calculate the multiplications between the powers of the first matrix and the second matrices.

22. The apparatus of claim 21, wherein each of the shift registers receives T-bit input, perform rotational shifts on the T-bit input and outputs a shifted T-bit output.

23. The apparatus of claim 21, wherein a number of the shift registers are identical to a row number of the second matrices and a number of the modulo-2 adders are identical to a row number of the first matrix.

24. The apparatus of claim 22, wherein the shift registers may control a shift stage according to the number of multiplications between the powers of the first matrix and the second matrices.

25. The apparatus of claim 24, wherein each of the shift registers shifts maximum T−1 bit.

* * * * *